(12) United States Patent
Zhang

(10) Patent No.: US 12,495,691 B2
(45) Date of Patent: Dec. 9, 2025

(54) DISPLAY SUBSTRATE AND METHOD OF MANUFACTURING THE SAME, DISPLAY PANEL, AND DISPLAY APPARATUS

(71) Applicants: Ordos Yuansheng Optoelectronics Co., Ltd., Inner Mongolia (CN); BOE TECHNOLOGY GROUP CO., LTD., Beijing (CN)

(72) Inventor: Guoping Zhang, Beijing (CN)

(73) Assignees: Ordos Yuansheng Optoelectronics Co., Ltd., Inner Mongolia (CN); Beijing BOE Technology Development Co., Ltd., Beijing (CN)

( * ) Notice: Subject to any disclaimer, the term of this patent is extended or adjusted under 35 U.S.C. 154(b) by 648 days.

(21) Appl. No.: 17/630,617

(22) PCT Filed: Apr. 16, 2021

(86) PCT No.: PCT/CN2021/087671
§ 371 (c)(1),
(2) Date: Jan. 27, 2022

(87) PCT Pub. No.: WO2021/213254
PCT Pub. Date: Oct. 28, 2021

(65) Prior Publication Data
US 2022/0254847 A1    Aug. 11, 2022

(30) Foreign Application Priority Data
Apr. 24, 2020    (CN) .................. 202010332566.X

(51) Int. Cl.
*H10K 59/35*    (2023.01)
*H10K 59/122*    (2023.01)
(Continued)

(52) U.S. Cl.
CPC ........... *H10K 59/35* (2023.02); *H10K 59/122* (2023.02); *H10K 59/80521* (2023.02); *H10K 59/1201* (2023.02); *H10K 2102/101* (2023.02)

(58) Field of Classification Search
None
See application file for complete search history.

(56) References Cited

U.S. PATENT DOCUMENTS

| | | | |
|---|---|---|---|
| 2004/0113550 A1* | 6/2004 | Adachi | H10K 59/8722 313/512 |
| 2005/0116620 A1* | 6/2005 | Kobayashi | H10K 59/877 313/506 |

(Continued)

FOREIGN PATENT DOCUMENTS

| | | |
|---|---|---|
| CN | 1728199 A | 2/2006 |
| CN | 107452750 A | 12/2017 |

(Continued)

OTHER PUBLICATIONS

China Patent Office, First Office Action dated May 23, 2022, for corresponding Chinese application No. 202010332566.X.

*Primary Examiner* — Steven B Gauthier
*Assistant Examiner* — E. Rhett Cheek
(74) *Attorney, Agent, or Firm* — HOUTTEMAN LAW LLC

(57) ABSTRACT

The present disclosure provides a display substrate and a method of manufacturing the same, a display panel, and a display apparatus. The display substrate includes a base substrate, pixel units are arranged in an array on the base substrate, each pixel unit includes an anode, a light-emitting functional layer and a cathode, a pixel definition layer is provided, and has a plurality of openings, and each opening exposes a portion of an anode; the light-emitting functional layer is located in the opening; at least a portion of two opposite ends of the anode along a first direction is warped (Continued)

in a direction toward the cathode, an orthographic projection of the warped portion of the anode on the base substrate does not overlap with that of the cathode on the base substrate, and a hollow region is provided at a position of the cathode at least corresponding to the warped portion.

8 Claims, 6 Drawing Sheets

(51) Int. Cl.
  *H10K 59/80* (2023.01)
  *H10K 59/12* (2023.01)
  *H10K 102/10* (2023.01)

(56) References Cited

U.S. PATENT DOCUMENTS

| | | | |
|---|---|---|---|
| 2006/0024855 A1 | 2/2006 | Sano | |
| 2011/0210348 A1* | 9/2011 | Yuasa | H10K 50/844 438/28 |
| 2015/0287770 A1* | 10/2015 | Sato | H10K 59/122 257/40 |
| 2016/0118449 A1* | 4/2016 | Sato | H10K 59/122 257/89 |
| 2016/0133677 A1 | 5/2016 | Yamamoto et al. | |
| 2017/0194396 A1* | 7/2017 | Choe | H10K 59/122 |
| 2017/0294626 A1* | 10/2017 | Aoki | H05B 33/12 |
| 2017/0345846 A1 | 11/2017 | Yang et al. | |
| 2018/0188837 A1* | 7/2018 | Son | H10K 59/122 |
| 2018/0308912 A1* | 10/2018 | Kim | H10K 50/81 |
| 2019/0067389 A1* | 2/2019 | Ai | H10K 50/11 |
| 2019/0221620 A1* | 7/2019 | Li | H10K 50/15 |
| 2020/0174602 A1* | 6/2020 | Feng | H10K 59/122 |
| 2021/0048904 A1* | 2/2021 | Xia | G06F 3/0446 |
| 2021/0104585 A1 | 4/2021 | Gao | |
| 2021/0367184 A1* | 11/2021 | Song | H10K 59/1315 |
| 2022/0223668 A1* | 7/2022 | Cui | H10K 59/122 |
| 2023/0337476 A1* | 10/2023 | Joo | H10K 59/1213 |

FOREIGN PATENT DOCUMENTS

| | | |
|---|---|---|
| CN | 107808897 A | 3/2018 |
| CN | 110148618 A | 8/2019 |
| CN | 111477761 A | 7/2020 |
| JP | 2007200907 A | 8/2007 |

* cited by examiner

DISPLAY SUBSTRATE AND METHOD OF MANUFACTURING THE SAME, DISPLAY PANEL, AND DISPLAY APPARATUS

CROSS-REFERENCE TO RELATED APPLICATIONS

The present disclosure claims the priority of the Chinese Patent Application No. 202010332566.X, filed on Apr. 24, 2020, the entire contents of which are incorporated herein by reference.

TECHNICAL FIELD

The present disclosure belongs to the field of display technology, and in particular, relates to a display substrate and a method of manufacturing the same, a display panel, and a display apparatus.

BACKGROUND

Organic electroluminescent devices, (e.g., organic light-emitting diodes (OLEDs)), have been extensively used in panel displays of mobile phones, in-vehicle displays, cameras and the like due to their excellent characteristics, such as self-luminance, wide color gamut, fast response time, slim panel, bendability, and cold resistance. The organic electroluminescent devices, widely recognized as the next-generation display technology, are on the rise to replace traditional liquid crystal displays.

An organic electroluminescent device is of a structure formed by stacking an anode, a light-emitting functional layer and a cathode on one another. During the preparation of the anode, it is necessary to use high-pressure water to continuously rinse a base substrate, which would cause two opposite ends of the prepared anode along a direction in which high-pressure water rinsing is performed to become warped and curled up, and the two ends of the anode that have become warped and curled up are very likely to break a pixel definition layer that defines a pixel region and the light-emitting functional layer to be directly shorted to a cathode layer, thus resulting in a dark spot defect in an OLED display panel and affecting the yield rate and quality of the OLED display panel.

SUMMARY

The present disclosure provides a display substrate, including: a base substrate and a plurality of pixel units arranged in an array and provided on the base substrate, each pixel unit of the plurality of pixel units including an anode, a light-emitting functional layer and a cathode stacked on the base substrate successively, a pixel definition layer being further provided on the base substrate, the pixel definition layer having a plurality of openings corresponding to the plurality of pixel units, respectively, and each opening of the plurality of openings exposing a portion of an anode of a corresponding pixel unit; the light-emitting functional layer being located on the portion of the anode that has been exposed in the opening; and the cathode being further extended to cover part of a surface of the pixel definition layer, wherein, for at least one pixel unit of the plurality of pixel units, an orthographic projection of at least one end of two opposite ends of the anode along a first direction on the base substrate does not overlap with an orthographic projection of the cathode on the base substrate, and a region of the cathode at least corresponding to the at least one end of the anode is configured as a hollow region.

In one embodiment, in the at least one end of the anode, at least a portion adjacent to an edge of the end is warped in a direction toward the cathode.

In one embodiment, the cathode for the plurality of pixel units is of an integrated structure.

In one embodiment, for each pixel unit of the plurality of pixel units, respective orthographic projections of two opposite ends of an anode of the pixel unit along the first direction on the base substrate do not overlap with the orthographic projection of the cathode on the base substrate, and a region of the cathode at least corresponding to the two opposite ends of the anode is configured as the hollow region; and the first direction is a row direction or a column direction of the array.

In one embodiment, an orthographic projection of the region of the two opposite ends of the anode along the first direction on the cathode coincides with the hollow region; or the hollow region of the cathode further covers a surface of a portion of the pixel definition layer contacting with the light-emitting functional layer.

In one embodiment, the hollow region of the cathode includes a plurality of sub-hollow regions, each sub-hollow region extends along a second direction orthogonal to the first direction in a fixed width, and the width is equal to a width of one end of the anode along the first direction; and when the first direction is the row direction of the array, the second direction is the column direction of the array; or, when the first direction is the column direction of the array, the second direction is the row direction of the array.

In one embodiment, the hollow region of the cathode includes a plurality of sub-hollow regions, each sub hollow regions extends along a second direction orthogonal to the first direction in a fixed width, and the width is equal to a sum of a width of one end of the anode along the first direction and a width of a surface of a portion of the pixel definition layer contacting with the light-emitting functional layer; and when the first direction is the row direction of the array, the second direction is the column direction of the array; or, when the first direction is the column direction of the array, the second direction is the row direction of the array.

In one embodiment, the display substrate further includes a plurality of spacers provided on a surface of the pixel definition layer at a side of the pixel definition layer away from the base substrate.

In one embodiment, a portion of the cathode is formed on respective surfaces of the plurality of spacers distal to the base substrate.

In one embodiment, a portion of the cathode is formed on respective surfaces of spacers at edges of the display substrate, among the plurality of spacers, and a portion of the cathode is not formed on respective surfaces of spacers other than the spacers at the edges of the display substrate, among the plurality of spacers.

In one embodiment, the base substrate includes a base and a pixel driving circuit provided on the base, the pixel definition layer and the plurality of pixel units are located at a side of the pixel driving circuit away from the base, and a planarization layer is further provided between the pixel driving circuit and the pixel definition layer as well as the plurality of pixel units.

In one embodiment, the anode is made of a transparent metal oxide material, and the cathode is made of a conductive metal material or a conductive metal alloy material.

The present disclosure further provides a display panel, including the above display substrate, and further including an encapsulation layer, which is aligned with the display substrate to encapsulate the plurality of pixel units in the display substrate.

The present disclosure further provides a display apparatus, including the above display panel.

The present disclosure further provides a method of manufacturing a display substrate, including: forming, on a base substrate, a plurality of pixel units arranged in an array; forming the plurality of pixel units including: preparing the base substrate; forming a plurality of anodes of the plurality of pixel units on the base substrate; forming a pixel definition layer, which includes a plurality of openings corresponding to the plurality of the pixel units, respectively, and each opening of the plurality of openings exposing a portion of an anode of a corresponding pixel unit; forming respective light-emitting functional layers of the plurality of pixel units on the portions of the anodes that have been exposed in the plurality of the openings; and forming a cathode at least on the light-emitting function layers of the plurality of pixel units, the cathode being further extended to cover part of a surface of the pixel definition layer, wherein, for at least one pixel unit of the plurality of pixel units, an orthographic projection of at least one end of two opposite ends of the anode along a first direction on the base substrate does not overlap with an orthographic projection of the cathode on the base substrate, and a hollow region is at least formed at a region of the cathode corresponding to the at least one end of the anode.

In one embodiment, forming the plurality of anodes of the plurality of pixel units on the base substrate includes continuously rinsing the base substrate with high-pressure water.

In one embodiment, forming the cathode on the light-emitting functional layers of the plurality of pixel unites includes forming the cathode by evaporation using a mask including a pattern of the cathode.

In one embodiment, a step of forming a plurality of spacers is performed after forming the pixel definition layer and before forming the light-emitting functional layers, and the plurality of spacers are provided on a surface of the pixel definition layer at a side of the pixel definition layer away from the base substrate; preparing the base substrate includes forming a pixel driving circuit on the base; and the method of manufacturing the display substrate further includes a step of forming a planarization layer on a side of the pixel driving circuit away from the base, after forming the pixel driving circuit and before forming the pixel definition layer.

In one embodiment, forming the cathode at least on the light-emitting function layers of the plurality of pixel units further includes forming the cathode on respective surfaces of the plurality of spacers distal to the surface.

In one embodiment, the plurality of spacers are configured to contact with the light-emitting functional layers, or the plurality of spacers are configured to be separated by a predetermined distance from the light-emitting functional layers.

BRIEF DESCRIPTION OF THE DRAWINGS

FIGS. 1A and 1B are a sectional view and a top view of a structure of an OLED display substrate in the related art, respectively, wherein FIG. 1A is the sectional view of the structure of the display substrate in FIG. 1B taken along a line AA;

FIGS. 2A and 2B are a top view and a sectional view of a structure of a display substrate according to some embodiments of the present disclosure, respectively, wherein FIG. 2B is the sectional view of the structure of the display substrate in FIG. 2A taken along a line AA;

FIGS. 3A and 3B are a top view and a sectional view of a structure of a display substrate according to some embodiments of the present disclosure, respectively, wherein FIG. 3B is the sectional view of the structure of the display substrate in FIG. 3A taken along a line AA;

FIGS. 4A and 4B are a top view and a sectional view of a structure of a display substrate according to some embodiments of the present disclosure, respectively, wherein FIG. 4B is the sectional view of the structure of the display substrate in FIG. 4A taken along a line AA;

FIGS. 6A and 6B are a top view and a sectional view of a structure of a display substrate according to some embodiments of the present disclosure, respectively, wherein FIG. 6B is the sectional view of the structure of the display substrate in FIG. 6A taken along line AA.

Figure 1A:
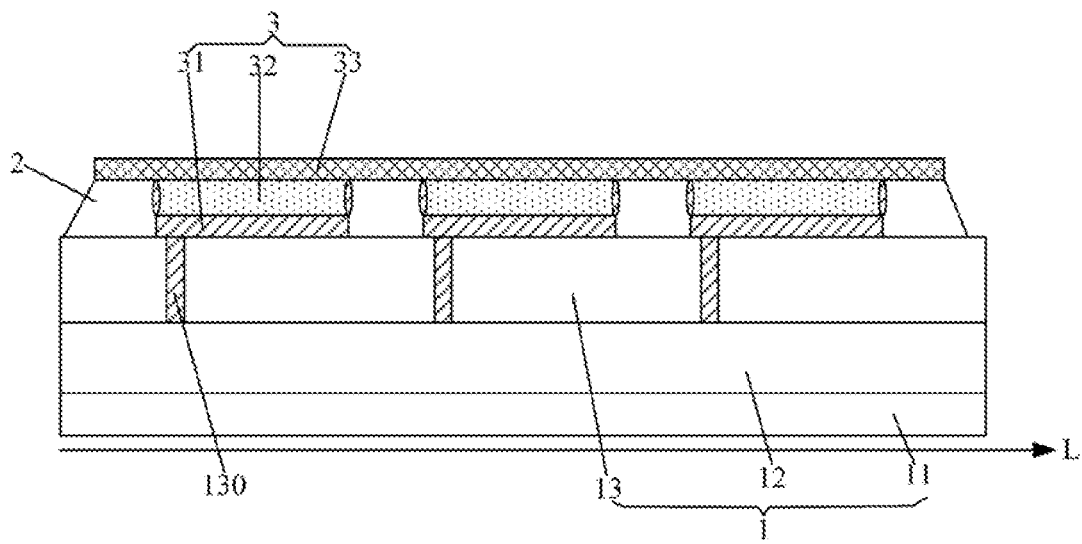

Reference numerals are listed as follows:
1. base substrate; 11. base; 12. pixel driving circuit; 13. planarization layer; 2. pixel definition layer; 3. pixel unit; 31. anode; 32. light-emitting functional layer; 33. cathode; 34. hollow region; L. first direction; M. second direction; 4. spacer; 130. via.

DETAILED DESCRIPTION OF EMBODIMENTS

To enable a person skilled in the art to better understand the technical solutions of the present disclosure, a detailed description is hereinafter given to the display substrate and the method of manufacturing the same, the display panel, and the display apparatus of the present disclosure with reference to accompanying drawings and embodiments.

To address the problem in the related art, that is, two ends of an anode along one direction being easy to warp and curl up such that the anode is very likely to be shorted to a cathode, which would result in a dark spot defect, the present disclosure provides a display substrate and a method of manufacturing the same, a display panel, and a display apparatus. The display substrate can prevent the anode with the two ends warped from contacting with corresponding positions on the cathode and being therefore shorted to the cathode, thereby avoiding a short circuit between the anode and the cathode and hence a dark spot defect at the place where the short circuit between the anode and the cathode would occur, and improving the yield rate and quality of the display substrate.

Figure 1B:
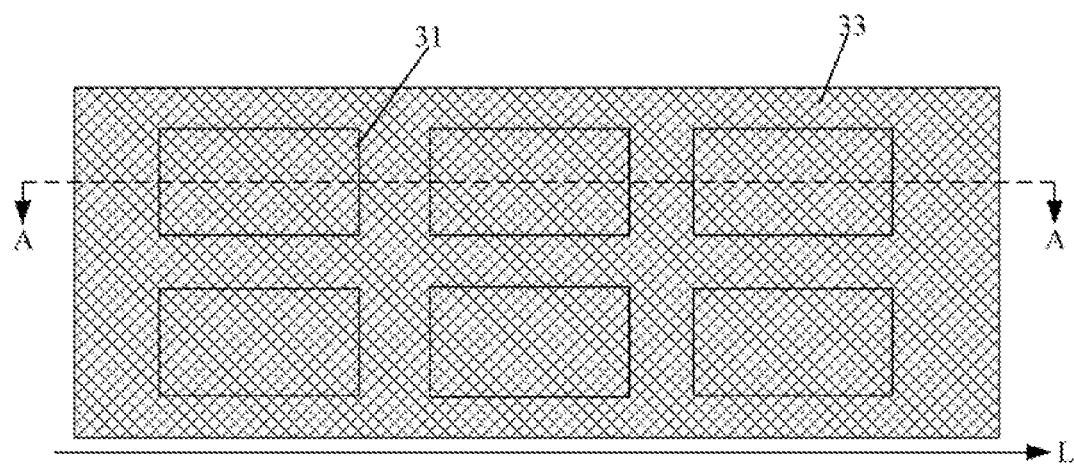

As illustrated in FIGS. 1A and 1B, two opposite ends of an anode 31 of an organic electroluminescent device (e.g., an organic light-emitting diode (OLED)) along a direction in which high-pressure water rinsing is performed are easy to warp and curl up, and the two ends of the anode 31 that have become warped and curled up are very likely to break a pixel definition layer 2 that defines a pixel region and a light-emitting functional layer 32 to be directly shorted to a film layer where a cathode 33 is formed, thus resulting in a dark spot defect in an OLED display panel and affecting the yield rate and quality of the OLED display panel. In the related art, for a plurality of light-emitting devices in an entire OLED display substrate, the cathode 33 may be of an integrated structure. As illustrated in FIG. 1A, two ends of an anode 31 of each light-emitting device along a first direction L are easy to warp, and therefore, there is a possibility of the anode 31 being shorted to a material of the cathode 33.

Figure 2A:
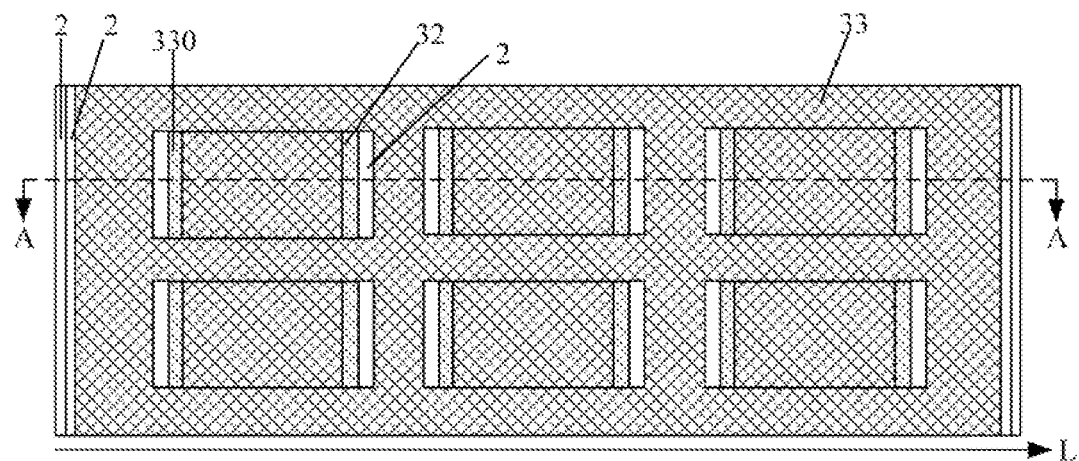
Figure 2B:
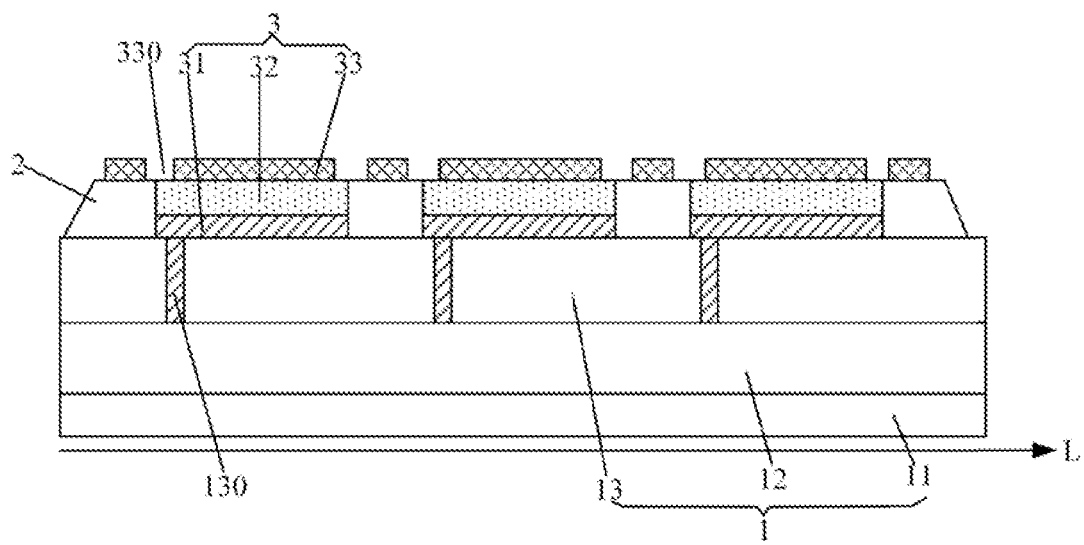

To address the above problem with the organic electroluminescent device in the related art, embodiments of the present disclosure provide a display substrate. As illustrated in FIGS. 2A and 2B, the display substrate includes a base substrate 1; a plurality of pixel units 3 are arranged in an array and provided on the base substrate 1; each of the plurality of pixel units 3 includes an anode 31, a light-emitting functional layer 32 and a cathode 33 stacked on the base substrate 1 successively; a pixel definition layer 2 is further provided on the base substrate 1, a plurality of openings are opened in the pixel definition layer 2, and a portion of the anode 31 is exposed at one opening; the light-emitting functional layer 32 is located in the opening; and the cathode 33 is further extended to cover a portion of the pixel definition layer 2, at least a portion of two opposite ends of the anode 31 along the first direction L is warped in a direction toward the cathode 33, an orthographic projection of the warped portion of the anode 31 on the base substrate 1 does not overlap with that of the cathode 33 on the base substrate 1, and in the cathode 33, a hollow region 330 is provided at a position at least corresponding to the warped portion of the anode 31.

By causing the orthographic projection of the warped portion of the anode 31 on the base substrate 1 not to overlap with that of the cathode 33 on the base substrate 1, and configuring a region of the cathode 33 at least corresponding to the warped portion of the anode 31 as a hollow region 330, the warped portion of the anode 31 can be prevented from contacting with a corresponding portion of the cathode 33 and being therefore shorted to the cathode 33, thereby avoiding a short circuit between the anode 31 and the cathode 33 and hence a dark spot defect at the place where the short circuit between the anode 31 and the cathode 33 would occur, and improving the yield rate and quality of the display substrate.

In some embodiments, the first direction L may be a row direction of the array formed by the plurality of pixel units 3. Of course, the first direction L may otherwise be a column direction of the array. During the preparation of the anode 31, if the base substrate 1 is rinsed with the high-pressure water along the row direction of the array, two opposite ends of the anode 31 along the row direction are easy to warp and curl up, and the first direction L is the row direction, whereas if the base substrate 1 is rinsed with the high-pressure water along the column direction of the array (i.e., the direction orthogonal to the first direction L), two opposite ends of the anode 31 along the column direction are easy to warp and curl up.

In some embodiments, respective orthographic projections of the two opposite ends of the anode 31 along the first direction L on the base substrate 1 at least partially coincide with those of the hollow regions 330 of the cathode 33 on the base substrate 1. In this way, when the two opposite ends of the anode 31 along the first direction L are warped and curled up, the anode 31 will not contact with the cathode 33 and be therefore shorted to the cathode 33, which avoids the dark spot defect in the display substrate. In the present disclosure, each of the two opposite ends of the anode 31 along the first direction L represents a portion of a predetermined length lying between an edge of the anode 31 and a central portion thereof along the first direction L. This portion, for example, is a portion easy to warp and curl up, and its length varies depending on the process of preparing the pixel unit and the size thereof. The respective lengths of the two opposite ends of the anode 31 along the first direction L may be determined according to actual situation, so as to determine the respective sizes of the corresponding hollow regions to be arranged, thereby maximizing the aperture ratio of the display substrate while preventing the shorting between the cathode and the anode.

Optionally, in some embodiments, an orthographic projection of the light-emitting functional layer 32 on the base substrate 1 at least partially covers those of the hollow regions 330 of the cathode 33 on the base substrate 1. In other words, the light-emitting functional layer 32 at least partially covers the two opposite ends of the anode 31 along the first direction L, but respective portions of the light-emitting functional layer corresponding to the two opposite ends of the anode 31 along the first direction L do not emit light because respective portions of the cathode 33 corresponding thereto have been configured as the hollow regions.

It is to be noted that the present disclosure is not limited thereto. Alternatively, the light-emitting functional layer may not cover the portions represented by the two opposite ends of the anode along the first direction L. The space above the portions of the anode 31 uncovered by the light-emitting functional layer may be filled by the pixel definition layer.

In some embodiments, the display substrate may further include a plurality of spacers 4. As illustrated in FIGS. 3A, 3B, 4A and 4B, the plurality of spacers 4 may be correspondingly provided on a surface of a region where the pixel definition layer 2 is located, and may be located at a side of the pixel definition layer 2 away from the base substrate 1. The plurality of spacers 4 can support an encapsulation layer configured to encapsulate the pixel units 3 so as to better protect the pixel units 3.

Figure 3A:
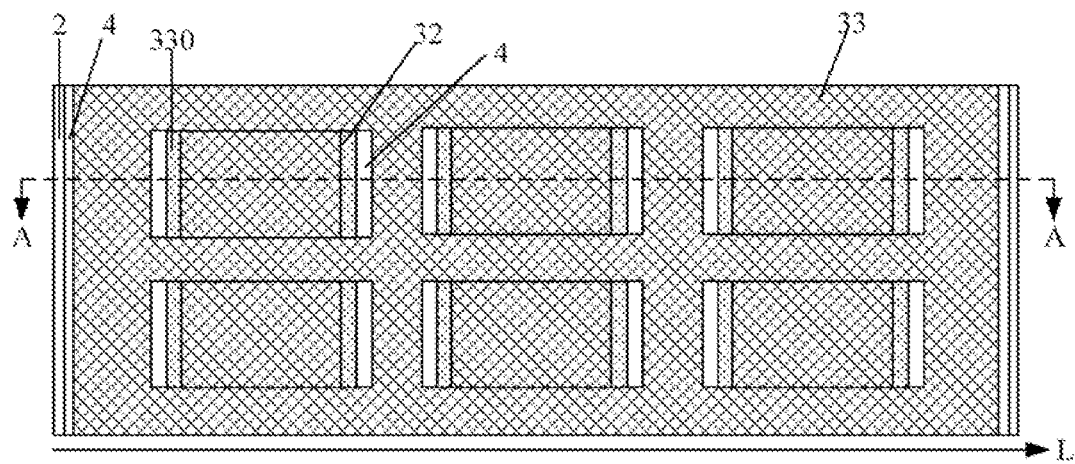
Figure 3B:
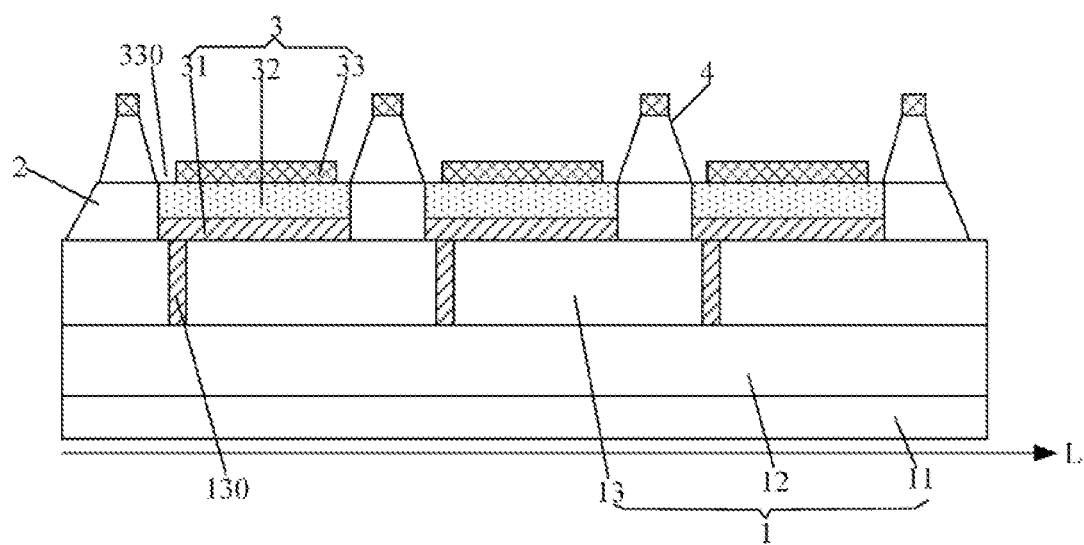

In the embodiment illustrated in FIGS. 3A and 3B, the plurality of spacers 4 are provided on the surface of the pixel definition layer 2 in such a manner that they adjoin various edges of the pixel definition layer 2, whereby the hollow regions 330 of the cathode 33 are provided on the light-emitting functional layers 32, as illustrated in FIG. 3B. In other words, as illustrated in FIG. 3A, in the cathode 33 of the entire display substrate, the cathode material is not provided in the regions corresponding to the two opposite ends of each anode 31 along the first direction L; and the cathode 33 is formed by the cathode material in other regions as an integrated structure. In some embodiments of the present disclosure, in order to further ensure that the anode 31 with the two ends along the first direction L warped is not shorted to the cathode 33, the cathode material is also not provided on two side surfaces of each spacer 4 along the first direction L, as illustrated in FIG. 3B. However, the present disclosure is not limited thereto. A display substrate with better performance compared to those in the related art can be obtained simply by providing a hollow region only for one of the two ends of an anode 31 along the first direction L in one of the plurality of pixel units.

Figure 4A:
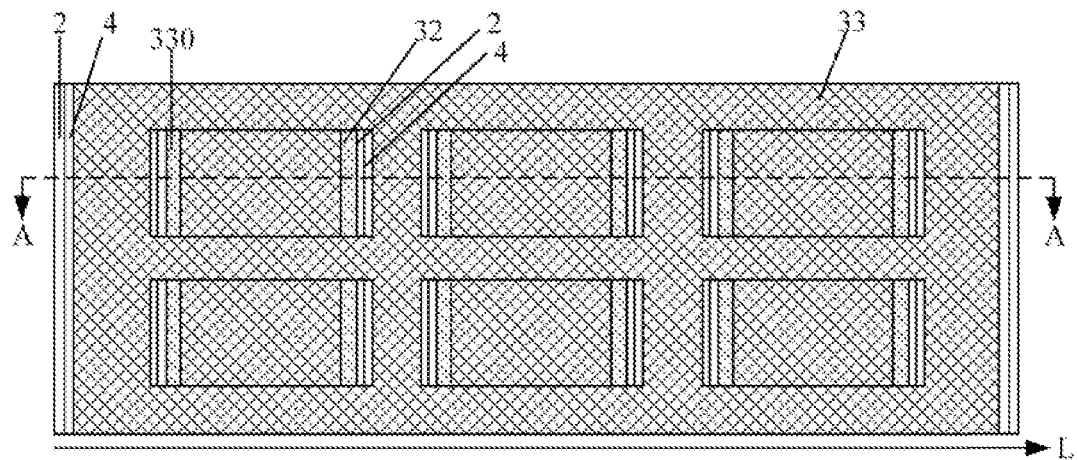
Figure 4B:
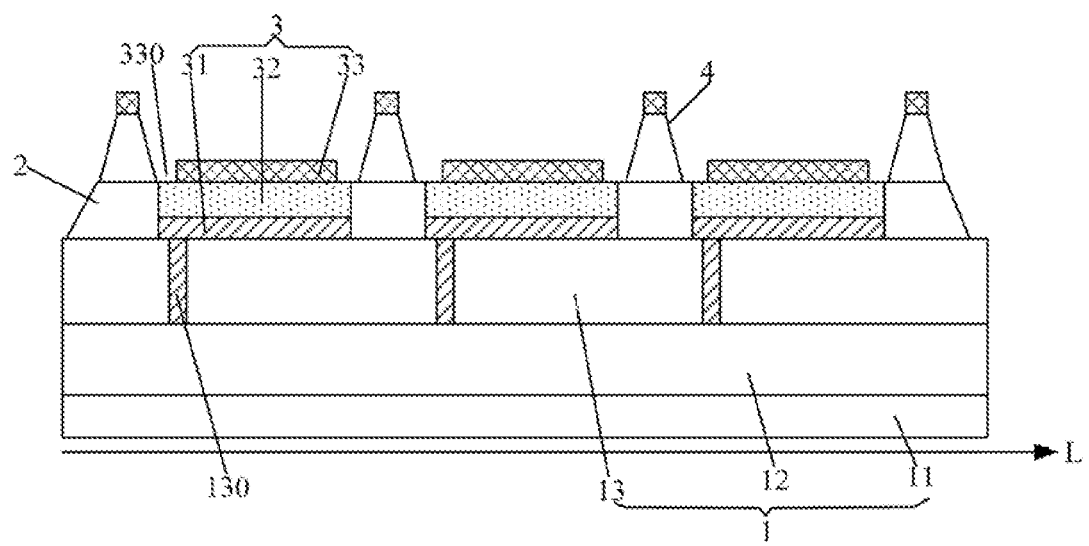

Unlike the embodiment illustrated in FIGS. 3A and 3B, the plurality of spacers 4 in one embodiment illustrated in FIGS. 4A and 4B are not arranged to adjoin the edges of the pixel definition layer, and instead, they are separated by a certain distance from respective light-emitting functional layers 32 in the first direction L so as not to adjoin the light-emitting functional layers 32, that is, the plurality of spacers 4 will cause part of the surface of the pixel definition layer 2 to be exposed in the first direction L, thereby further increasing the distance between the cathode material formed on an upper surface of each spacer 4 and the two ends of the corresponding anode 31 along the first direction L to further ensure that the anode 31 is not shorted to the cathode material.

In some embodiments, as illustrated in FIGS. 3B and 4B, the base substrate 1 includes a base 11 and a pixel driving circuit 12 provided on the base 1, the pixel definition layer 2 and the pixel units 3 are located at a side of the pixel driving circuit 12 away from the base 11, and a planarization layer is further provided between the pixel driving circuit 12 and the pixel definition layer 2 as well as the pixel units 3. The pixel driving circuit 12 is connected to the anode 31 of each pixel unit 3 through a via 130 opened in the planarization layer in order to drive the pixel unit 3 to emit light. The arrangement of the planarization layer is beneficial to flatten the surface of the base substrate 1, so as to form the pixel definition layer 2 and the pixel units 3 on the base substrate 1 by an evaporation process.

In some embodiments, the pixel unit 3 may be an OLED or a Light Emitting Diode (LED). The anode 31 may be made of a transparent metal-oxide material, such as indium-tin oxide (ITO) or the like; and the cathode 33 may be made of a conductive metal material or a conductive metal alloy material, such as aluminum, silver, magnesium alloy, calcium or the like. The light-emitting functional layer 32, for example, may include an electron transport layer, a luminescent layer and a hole transport layer.

Based on the above construction of the display substrate, some embodiments further provide a method of manufacturing the display substrate. The method includes: forming a plurality of pixel units on a base substrate, the plurality of pixel units being arranged in an array; and forming the plurality of pixel units including a step of forming, on the base substrate, an anode, a light-emitting functional layer and a cathode of each pixel unit successively. The method further includes: forming a pixel definition layer and a plurality of openings in the pixel definition layer, wherein a portion of the anode is exposed at one opening; the light-emitting functional layer is located on the exposed portion of the anode in the opening; and the cathode is further extended to cover the pixel definition layer, at least a portion of two opposite ends of the anode along a first direction is warped in a direction toward the cathode, and an orthographic projection of the warped portion of the anode on the base substrate does not overlap with that of the cathode on the base substrate, and in the cathode, a hollow region is formed at a position at least corresponding to the warped portion of the anode.

In some embodiments, forming the cathode includes: forming the cathode by evaporation using a mask including a cathode pattern, wherein orthographic projections of the portions represented by the two opposite ends of the anode along the first direction on the cathode coincide with the hollow regions, respectively.

It is to be noted that the cathode may otherwise be formed by a traditional patterning process (including the steps of cathode film layer deposition, photoresist coating, exposure, development, etching and the like). The mask used in the exposure step is the mask including the cathode pattern. As the specific process of preparing the cathode is well developed, it will not be repeated herein.

In the method of manufacturing the display substrate in some embodiments, the specific process of forming the pixel definition layer and the pixel units on the base substrate is to be described as follows:

S1: Form a pattern of the plurality of anodes on the base substrate. The plurality of anodes may be formed by either the patterning process or the evaporation process. In this step, the plurality of anodes for the plurality of pixel units are formed on the base substrate as discrete anodes, which are electrically insulated and spaced apart from one another to independently control respective pixel units to emit light.

S2: Form a pattern of the pixel definition layer including the plurality of openings on the base substrate upon completion of the step S1. The pixel definition layer is formed by processes including film layer coating, exposure and development, or by the evaporation process, wherein an edge of each anode is typically located under the pixel definition layer. In this step, the pattern of the pixel definition layer including the plurality of openings is formed based on the formed pattern of the plurality of anodes, and the pattern of the pixel definition layer may cover respective edges of the pattern of the plurality of anodes to expose respective large parts of the plurality of anodes, and these parts act as a plurality of pixel regions for the plurality of pixel units; for example, the pattern of the pixel definition layer may cover edge regions of the plurality of anodes to expose respective central regions of the plurality of anodes.

S3: Form a plurality of light-emitting functional layers on the base substrate upon completion of the step S3. The film layers in each light-emitting functional layer (i.e., the electron transport layer, the luminescent layer, the hole transport layer and the like) are all formed by the evaporation process. In this step, a light-emitting material for the plurality of light-emitting functional layers is provided in the plurality of openings defined by the pixel definition layer.

S4: Form the cathode on the base substrate upon completion of the step S3. The cathode is formed by the evaporation process or the traditional patterning process. In this step, the formed cathodes for the plurality of pixel units may be of an integrated structure (a one-piece structure).

In some embodiments, the method of manufacturing the display substrate may further include a step of forming a plurality of spacers, after forming the pixel definition layer and before forming the light-emitting functional layer, and the plurality of spacers may be formed on the surface of the pixel definition layer, and may be located at a side of the pixel definition layer away from the base substrate. The plurality of spacers may be formed by the process including the steps of film layer coating, exposure and development. The plurality of spacers are configured to support a subsequently formed encapsulation layer that encapsulates the pixel units.

In some embodiments, forming the base substrate includes forming a pixel driving circuit on a base, with the pixel definition layer and the plurality of pixel units located at a side of the pixel driving circuit away from the base; and further includes forming a planarization layer at the side of the pixel driving circuit away from the base, after forming the pixel driving circuit and before forming the pixel definition layer. Each film layer of the pixel driving circuit may be formed by the traditional patterning process, and the planarization layer may be formed by the process including the steps of film layer coating, exposure and development. The planarization layer can make the surface of the base substrate where the pixel driving circuit has been formed flat and even, thereby facilitating the formation of the plurality of pixel units thereon.

Figure 5:
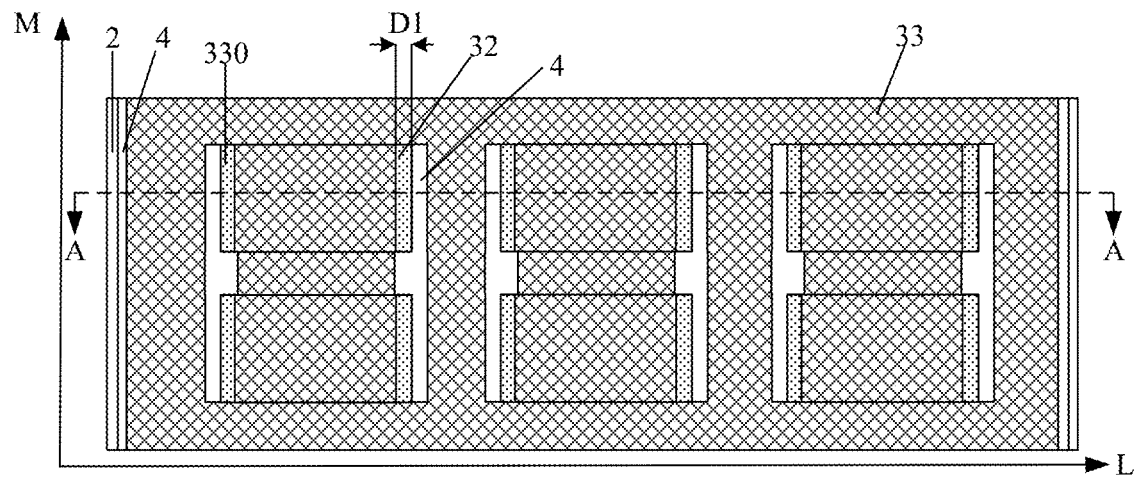
FIG. 5 is a top view of a structure of a display substrate according to some embodiments of the present disclosure.

Some embodiments of the present disclosure further provide a display substrate, in which, unlike the foregoing embodiments, the hollow regions 330 of the cathode 330 may be configured to extend, along the column direction of the entire display substrate, from respective positions corresponding to the two opposite ends of the anode 31 along the first direction L, in order to reduce the complexity of preparing the mask pattern for the cathode 33, as illustrated in FIG. 5. In the embodiments illustrated in FIGS. 3A and 4A, for each pixel unit, hollow regions 330 each are provided at respective regions of the cathode 33 corresponding to the two ends of the anode 31 along the first direction L, and respective hollow regions 330 of two adjacent pixel units along the column direction are spaced apart from each other. Unlike the embodiments illustrated in FIGS. 3A and 4A, in one embodiment illustrated in FIG. 5, respective hollow regions 330 of two adjacent pixel units along the column direction are merged with each other along the column direction (i.e., they are formed as an integrated structure).

In the embodiment illustrated in FIG. 5, orthographic projections, on the cathode 33, of regions respectively extending along a second direction M in a fixed width from the portions represented by the two opposite ends of the anode 31 along the first direction L coincide with the hollow regions 330, respectively, wherein the width refers to a dimension, along the first direction L, of each of the regions of the two opposite ends of the anode along the first direction L, the first direction L refers to the row direction of the array, and the second direction M refers to the column direction thereof. Each end of the two opposite ends has a length in the first direction L of D1.

Similarly, in the case of the warping of the portions represented by the two opposite ends of the anode 31 along the first direction L, the above arrangement of the display substrate as described in this embodiment can prevent the anode 31 from contacting with the corresponding cathode 33 and being therefore shorted to the cathode 33, because the cathode material is not provided in the regions corresponding to the above portions, and therefore, the dark spot defect in the display substrate can be avoided. Meanwhile, since the area of the hollow region 330 in the cathode 33 is larger than that of the hollow region in the embodiments illustrated in FIGS. 3A and 4B, the material cost can be saved and the complexity of manufacturing the display substrate can be reduced, thereby reducing the production cost, as compared to the foregoing embodiments.

Other structures in the display substrate in this embodiment are identical to those in the foregoing embodiments, and will not be repeated herein.

The method of manufacturing the display substrate in this embodiment is identical to that in the embodiments illustrated in FIGS. 3A and 4A except for the cathode pattern on the mask used in the formation of the cathode, and will not be repeated herein.

Figure 6A:
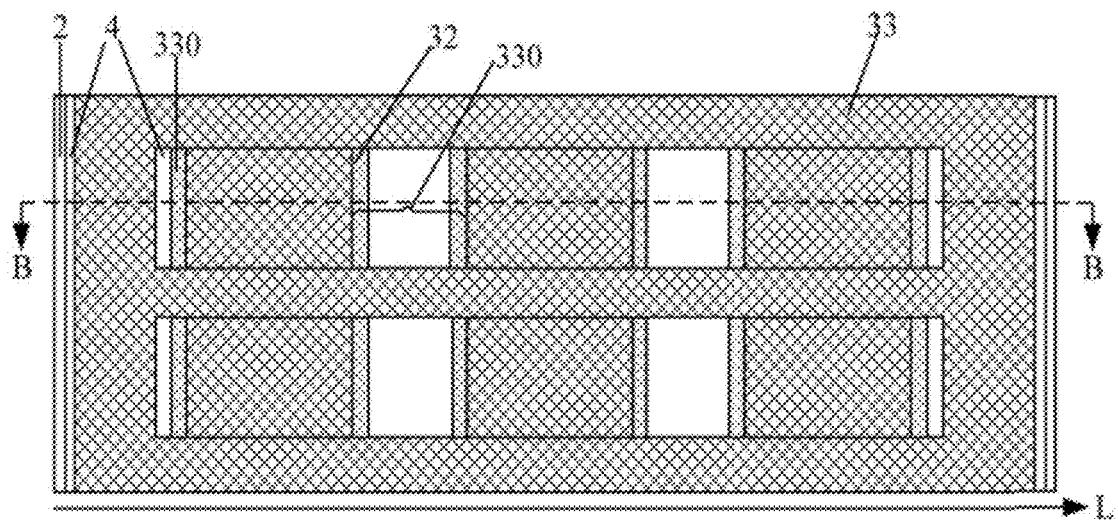
Figure 6B:
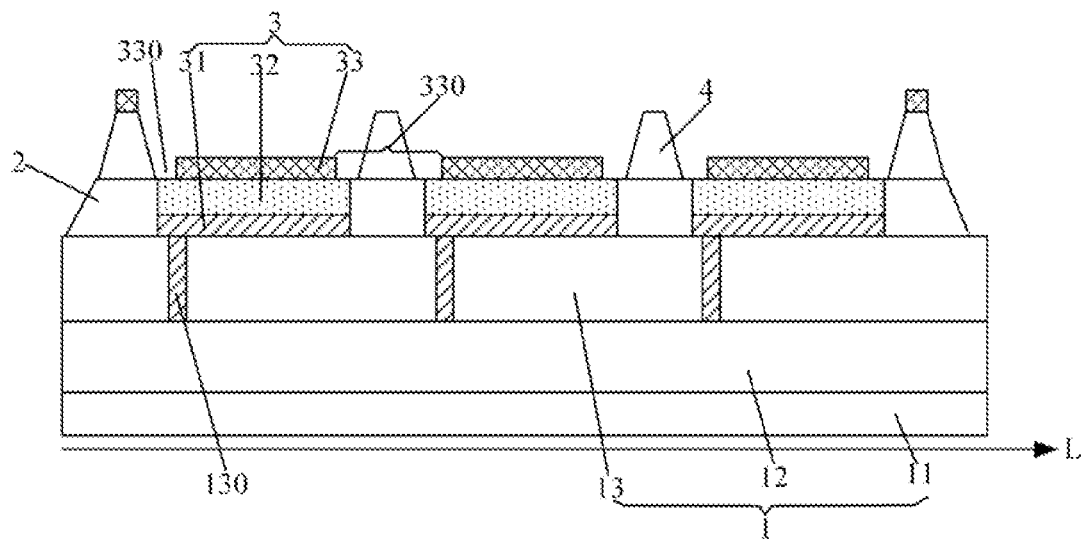

Some embodiments of the present disclosure further provide a display substrate, in which, unlike the foregoing embodiments, an orthographic projection, on the cathode 33, of a region composed of a gap between every two adjacent anodes 31 along the first direction L and two ends of these anodes 31 that face each other coincides with a hollow region 330, as illustrated in FIGS. 6A and 6B. In other words, the cathode material is not provided in the regions corresponding to the two opposite ends of each anode 31 along the first direction L and the gap between every two adjacent anodes 31 along the first direction L. As illustrated in FIG. 6A, the gap between the respective cathode material regions above every two adjacent anodes 31 along the first direction L (row direction) is made even larger, which can further prevent the shorting between the cathode 33 and the anode 31.

Similarly, in the case of the warping and curling-up of the two opposite ends of the anode 31 along the first direction L, the above arrangement can prevent the anode 31 from contacting with the cathode 33 and being therefore shorted to the cathode 33, thereby avoiding the dark spot defect in the display substrate. Meanwhile, compared to the foregoing embodiments of the display substrate, the area of the hollow region 330 of the cathode 33 is made even larger in this embodiment, which can save the material cost and reduce the complexity of the process, thereby reducing the production cost.

Other structures in the display substrate in this embodiment are identical to those in the foregoing embodiments, and will not be repeated herein.

The method of manufacturing the display substrate in this embodiment is identical to that in the foregoing embodiments except for the cathode pattern on the mask used in the formation of the cathode, and will not be repeated herein.

Figure 7:
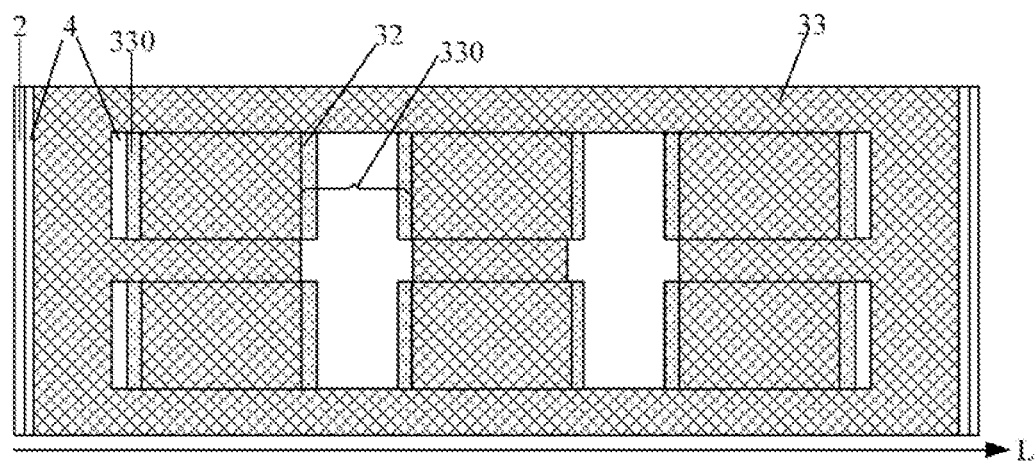
FIG. 7 is a top view of a structure of a display substrate according to some embodiments of the present disclosure.

Some embodiments of the present disclosure further provide a display substrate, in which, unlike the foregoing embodiments, the first direction L is the row direction of the array, and an orthographic projection, on the cathode 33, of a region composed of a gap between respective anodes 31 of every two adjacent columns of pixel units 2 and two ends of these anodes 31 that face each other coincides with a hollow region 330, as illustrated in FIG. 7. In this embodiment, in order to reduce the complexity of preparing the mask pattern for the cathode 33, the hollow region 330 of the cathode may be configured to extend along the column direction of the entire display substrate in a width equal to the sum of a width of a region between respective anodes 31 of every two adjacent columns of pixel units 2 along the first direction L and two ends of these anodes 31 that face each other (however, the hollow regions 330 close to edges of the display substrate do not extend along the column direction, as illustrated in FIG. 7). In the embodiment illustrated in FIG. 7, the hollow regions along the column direction are merged with each other (i.e., they are formed as an integrated structure), and a width of the merged hollow region along the row direction may include a width of the two opposite ends of each anode 31 uncovered by the cathode 33 along the first direction L and a distance between the two adjacent anodes 31, and a length of the merged hollow region along the column direction M may include a distance between an end of an anode 31 of the first row of pixel units close to one edge of the display substrate and an end of an anode 31 of the second row of pixel units close to the other edge of the display substrate. However, the present disclosure is not limited thereto. For example, with the pattern of the cathode layer as an integrated structure, the hollow regions may be configured as needed.

Similarly, in the case of the warping and curling-up of the portions represented by the two opposite ends of the anode 31 along the first direction L, the above arrangement can prevent the anode 31 from contacting with the cathode 33 and being therefore shorted to the cathode 33, thereby avoiding the dark spot defect in the display substrate. Meanwhile, compared to the foregoing embodiments of the display substrate, the area of the hollow region 330 of the cathode 33 is made even larger in this embodiment, which can save the material cost and reduce the complexity of preparing the mask pattern for the cathode 33, thereby reducing the production cost.

Other structures in the display substrate in this embodiment are identical to those in the foregoing embodiments, and will not be repeated herein.

The method of manufacturing the display substrate in this embodiment is identical to that in the foregoing embodiments except for the cathode pattern on the mask used in the formation of the cathode, and will not be repeated herein.

In the display substrate provided in the foregoing embodiments of the present disclosure, by configuring a region of the cathode corresponding to the warped portion of the anode as a hollow region (i.e., by removing the cathode material in the region corresponding to the warped portion of the anode), the warped anode can be prevented from contacting with the cathode and being therefore shorted to the cathode, which can avoid a short circuit between the anode and the cathode and hence the dark spot defect at the place where the short circuit between the anode and the cathode would occur, thereby improving the yield rate and quality of the display substrate.

Some embodiments of the present disclosure further provide a display panel, including the display substrate and the encapsulation layer according to any one of the foregoing embodiments, wherein the encapsulation layer is aligned with the display substrate to encapsulate the plurality of pixel unites in the display substrate.

By adopting the display substrate according to any one of the foregoing embodiments, the display panel of present disclosure can prevent a short circuit between the anode and the cathode from occurring in the display panel, thereby avoiding the dark spot defect caused by the short circuit in the display panel and improving the yield rate and quality of the display panel.

Some embodiments of the present disclosure further provide a display apparatus, including the display panel according to the foregoing embodiments.

By adopting the display panel according to the foregoing embodiments, the yield rate and quality of the display apparatus can be improved.

The display apparatus provided in embodiments of the present disclosure may be any product or component having a display function, such as an OLED panel, an OLED television, an LED panel, an LED television, a monitor, a mobile phone, a navigator or the like.

It is to be understood that the foregoing embodiments are merely exemplary embodiments for the purpose of illustrating the principle of the present disclosure. However, the present disclosure is not limited thereto. Various modifications and improvements can be made by a person skilled in the art without departing from the spirit and essence of the present disclosure. Accordingly, all of the modifications and improvements also fall into the protection scope of the present disclosure.

The invention claimed is:

1. A display panel, comprising a display substrate and an encapsulation layer, wherein
the display substrate comprises a base substrate and a plurality of pixel units arranged in an array and provided on the base substrate, each pixel unit of the plurality of pixel units comprising an anode, a light-emitting functional layer and a cathode stacked on the base substrate successively, a pixel definition layer being further provided on the base substrate, the pixel definition layer having a plurality of openings corresponding to the plurality of pixel units, respectively, and each opening of the plurality of openings exposing a portion of an anode of a corresponding pixel unit; the light-emitting functional layer being located on the portion of the anode that has been exposed in the opening; and a part of a surface away from the base substrate of a plurality of spacers covered by a cathode layer having the same material as the cathode on the light-emitting functional layer,
for at least one pixel unit of the plurality of pixel units, an orthographic projection of at least one end of two opposite ends of the anode along a first direction on the base substrate does not overlap with an orthographic projection of the cathode on the base substrate, and a region of the cathode at least corresponding to the at least one end of the anode is configured as a hollow region;
respective hollow regions of two adjacent pixel units along a second direction orthogonal to the first direction are merged with each other along the second direction and formed as a single piece; and
the encapsulation layer is aligned with the display substrate to encapsulate the plurality of pixel units in the display substrate;
wherein for each pixel unit of the plurality of pixel units, respective orthographic projections of two opposite ends of the anode of the pixel unit along the first direction on the base substrate do not overlap with the orthographic projection of the cathode of the pixel unit on the base substrate, and a region of the cathode at least corresponding to the two opposite ends of the anode is configured as the hollow region; and the first direction is a row direction or a column direction of the array;
the plurality of spacers are provided on a surface of the pixel definition layer at a side of the pixel definition layer away from the base substrate, and configured to support the encapsulation layer;
a surface of the pixel definition layer away from the base substrate is flush with a surface of the light-emitting functional layer away from the base substrate;
at the hollow region, the cathode layer on the plurality of spacers and the cathode on the light-emitting functional layer are separated from each other in the first direction by a distance equal to a length of the hollow region in the first direction, and at the hollow region, the plurality of spacers and the cathode on the light-emitting functional layer are separated from each other in the first direction by a distance equal to a length of one end of the two opposite ends of the anode along the first direction; and
the first direction is the row direction of the array, and the second direction is the column direction of the array; or the first direction is the column direction of the array, and the second direction is the row direction of the array.

2. A display apparatus, comprising the display panel according to claim 1.

3. The display panel according to claim 1, wherein of the at least one end of the anode, at least a portion adjacent to an edge of the end is warped in a direction toward the cathode.

4. The display substrate according to claim 1, wherein cathodes for the plurality of pixel units is of a one-piece structure.

5. The display substrate according to claim 1, wherein a portion of the cathode is formed on respective surfaces of the plurality of spacers distal to the base substrate.

6. The display substrate according to claim 1, wherein a portion of the cathode is formed on respective surfaces of spacers at edges of the display substrate, among the plurality of spacers, and the cathode is not formed on respective surfaces of spacers other than the spacers at the edges of the display substrate, among the plurality of spacers.

7. The display substrate according to claim 1, wherein the base substrate comprises a base and a pixel driving circuit provided on the base, the pixel definition layer and the plurality of pixel units are located at a side of the pixel driving circuit away from the base, and a planarization layer is further provided between the pixel driving circuit and the pixel definition layer, and between the pixel driving circuit and the plurality of pixel units.

8. The display substrate according to claim 1, wherein the anode is made of a transparent metal oxide material and the cathode is made of a conductive metal material or a conductive metal alloy material.

* * * * *